(12) United States Patent
Kosuga

(10) Patent No.: US 10,277,019 B2
(45) Date of Patent: Apr. 30, 2019

(54) ELECTRIC CIRCUIT APPARATUS

(71) Applicant: Hitachi Automotive Systems, Ltd., Hitachinaka-shi, Ibaraki (JP)

(72) Inventor: Masashi Kosuga, Ibaraki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/756,870

(22) PCT Filed: Aug. 2, 2016

(86) PCT No.: PCT/JP2016/072575
§ 371 (c)(1),
(2) Date: Mar. 1, 2018

(87) PCT Pub. No.: WO2017/043219
PCT Pub. Date: Mar. 16, 2017

(65) Prior Publication Data
US 2018/0254620 A1   Sep. 6, 2018

(30) Foreign Application Priority Data

Sep. 11, 2015   (JP) .................................. 2015-179051

(51) Int. Cl.
*H02G 3/16* (2006.01)
*H05K 5/00* (2006.01)
(Continued)

(52) U.S. Cl.
CPC ............. *H02G 3/16* (2013.01); *H01R 13/502* (2013.01); *H01R 13/5219* (2013.01); *H02M 7/48* (2013.01)

(58) Field of Classification Search
CPC . H02G 3/08; H02G 3/081; H02G 3/16; H01R 13/502; H01R 13/5219;
(Continued)

(56) References Cited

U.S. PATENT DOCUMENTS 8,207,454 B2 *   6/2012   Darr .................... H05K 7/026
174/520
8,378,211 B2 *   2/2013   Oka ..................... H02G 3/086
174/50
(Continued)

FOREIGN PATENT DOCUMENTS

DE    37 28 456 A1    3/1989
EP    2 161 790 A1    3/2010
(Continued)

OTHER PUBLICATIONS

International Search Report (PCT/ISA/210) issued in PCT Application No. PCT/JP2016/072575 dated Oct. 4, 2016 with English-language translation (three (3) pages).
(Continued)

*Primary Examiner* — Angel R Estrada
(74) *Attorney, Agent, or Firm* — Crowell & Moring LLP

(57) ABSTRACT

An electric circuit apparatus capable of enhancing connection workability is provided. An electric circuit apparatus includes: a connector that transmits one or a driving current and a signal to an electric circuit unit; a substrate connected to the connector; a first case member forming an housing space for the substrate and forming an opening portion; and an intermediate member interposed between the connector and the first case member, in which the intermediate member includes a connector-side opening portion through which the connector passes, a seal surface with the connector, and a fix in portion to be fixed on the first case member, and the fixing portion is formed so as to absorb a positional tolerance between the connector and the opening portion of the first case member.

8 Claims, 18 Drawing Sheets

(51) Int. Cl.
*H02M 7/48* (2007.01)
*H01R 13/502* (2006.01)
*H01R 13/52* (2006.01)

(58) Field of Classification Search
CPC .. H02M 7/48; H05K 5/00; H05K 5/02; H05K 5/0004; H05K 7/026; H05K 7/02
USPC ........... 174/59, 50, 520, 535, 559; 439/76.1, 439/76.2
See application file for complete search history.

(56) References Cited

U.S. PATENT DOCUMENTS

| | | | | |
|---|---|---|---|---|
| 8,389,856 | B2* | 3/2013 | Ozawa | H02G 3/088 |
| | | | | 174/50 |
| 8,946,565 | B2* | 2/2015 | Hattori | H05K 5/0004 |
| | | | | 174/520 |
| 8,957,308 | B2* | 2/2015 | Uchida | B60R 16/0238 |
| | | | | 174/50 |
| 2012/0322285 | A1 | 12/2012 | Homme | |
| 2014/0084834 | A1 | 3/2014 | Saito | |

FOREIGN PATENT DOCUMENTS

| | | | |
|---|---|---|---|
| JP | 2007-127206 | A | 5/2007 |
| JP | 2012-124992 | A | 6/2012 |
| JP | 2013-4254 | A | 1/2013 |
| JP | 2014-64419 | A | 4/2014 |
| JP | 2014-150017 | A | 8/2014 |

OTHER PUBLICATIONS

Japanese-language Written Opinion (PCT/ISA/237) issued in PCT/JP2016/072575 dated Oct. 4, 2016 (Five (5) pages).
Extended European Search Report issued in counterpart European Application No. 16844083.2 dated Feb. 21, 2019 (seven (7) pages).

* cited by examiner

UPWARD ⟵⟶ DOWNWARD

UPWARD ←——→ DOWNWARD

E-E

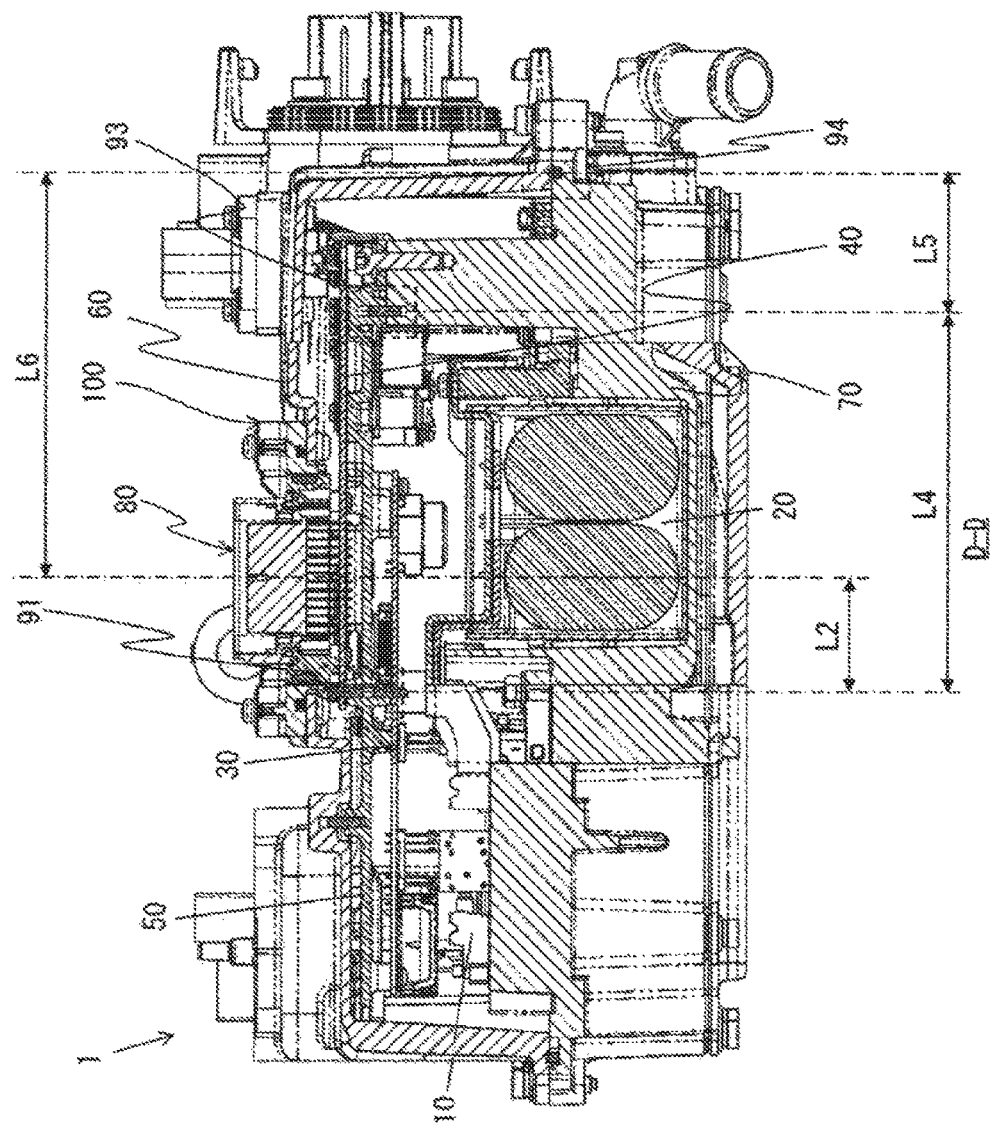

ELECTRIC CIRCUIT APPARATUS

TECHNICAL FIELD

The present invention relates to an electric circuit apparatus.

BACKGROUND ART

There is a known electronic device that houses a substrate inside a case and configured to connect a connector attached to the substrate to an external connection member via an opening portion of the case (refer to PTL 1). In this electronic device, the substrate and the contact of the connector are fixed by solder.

CITATION LIST

Patent Literature

PTL 1: JP 2013-004254 A

SUMMARY OF INVENTION

Technical Problem

In a case where the connector is allowed to protrude to the outside of the case like the electronic device described in the above-described patent documents, there is a demand for further enhancement in connection workability while maintaining the sealability inside the case.

Solution to Problem

An electric circuit apparatus in accordance with the present invention includes a connector that transmits one of a driving current and a signal to an electric circuit unit; a substrate connected to the connector; a first case member forming an housing space for the substrate and forming an opening portion; and an intermediate member interposed between the connector and the first case member, in which the intermediate member includes a connector-side opening portion through which the connector passes, a seal surface with the connector, and a fixing portion to be fixed on the first case member, and the fixing portion is formed so as to absorb a positional tolerance between the connector and the opening portion of the first case member.

Advantageous Effects of Invention

According to the present invention, it is possible to enhance connection workability.

BRIEF DESCRIPTION OF DRAWINGS

FIG. 18 is a cross-sectional view taken along plane D-D in FIG. 1.

DESCRIPTION OF EMBODIMENT

Hereinafter, embodiments of the present invention will be described with reference to the drawings. Hereinafter, a power conversion apparatus mounted on an electric vehicle such as an electric automobile or a hybrid automobile will be described as an exemplary electric circuit apparatus.

Figure 1:
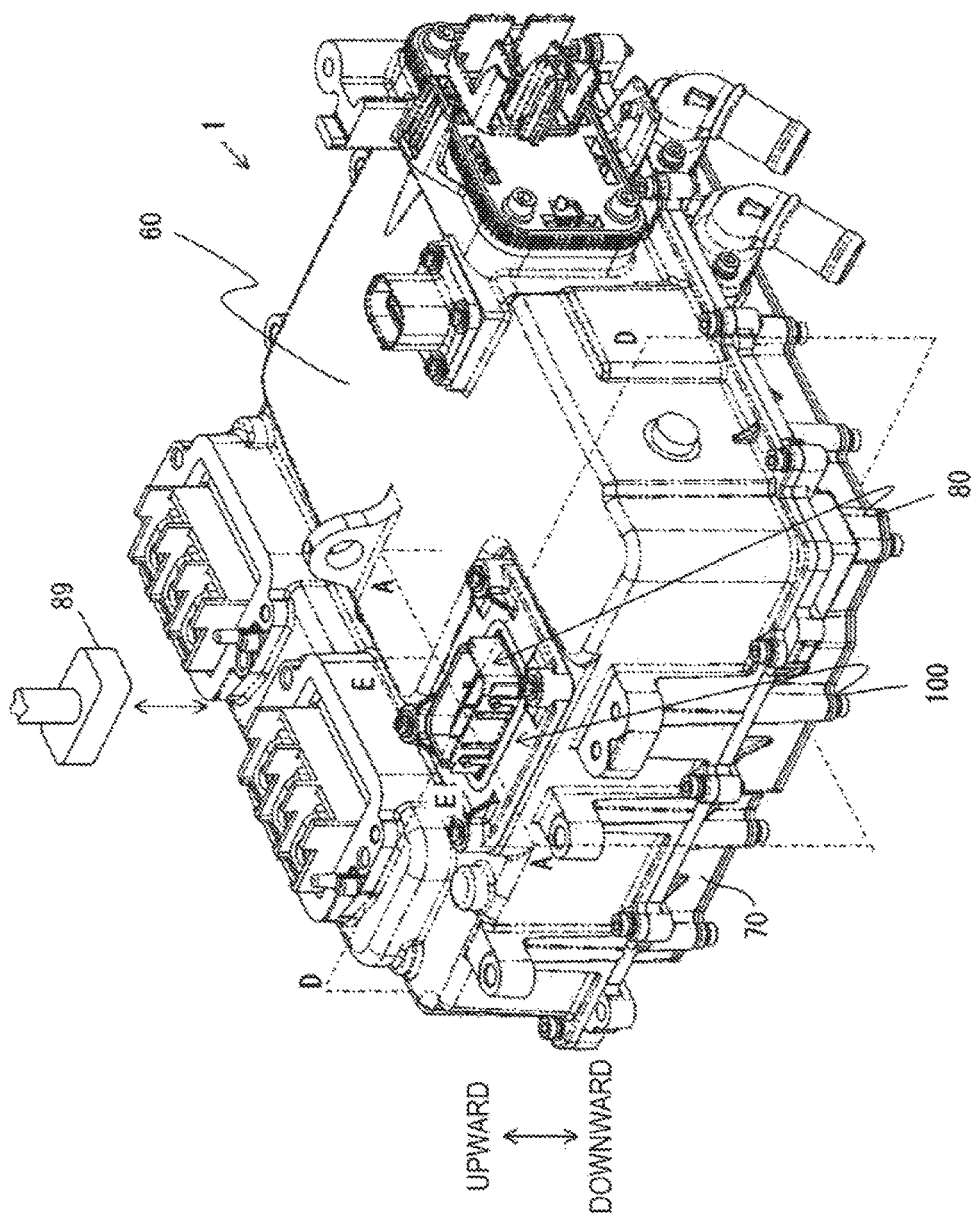
FIG. 1 is a perspective view illustrating an appearance of a power conversion apparatus.
Figure 2:
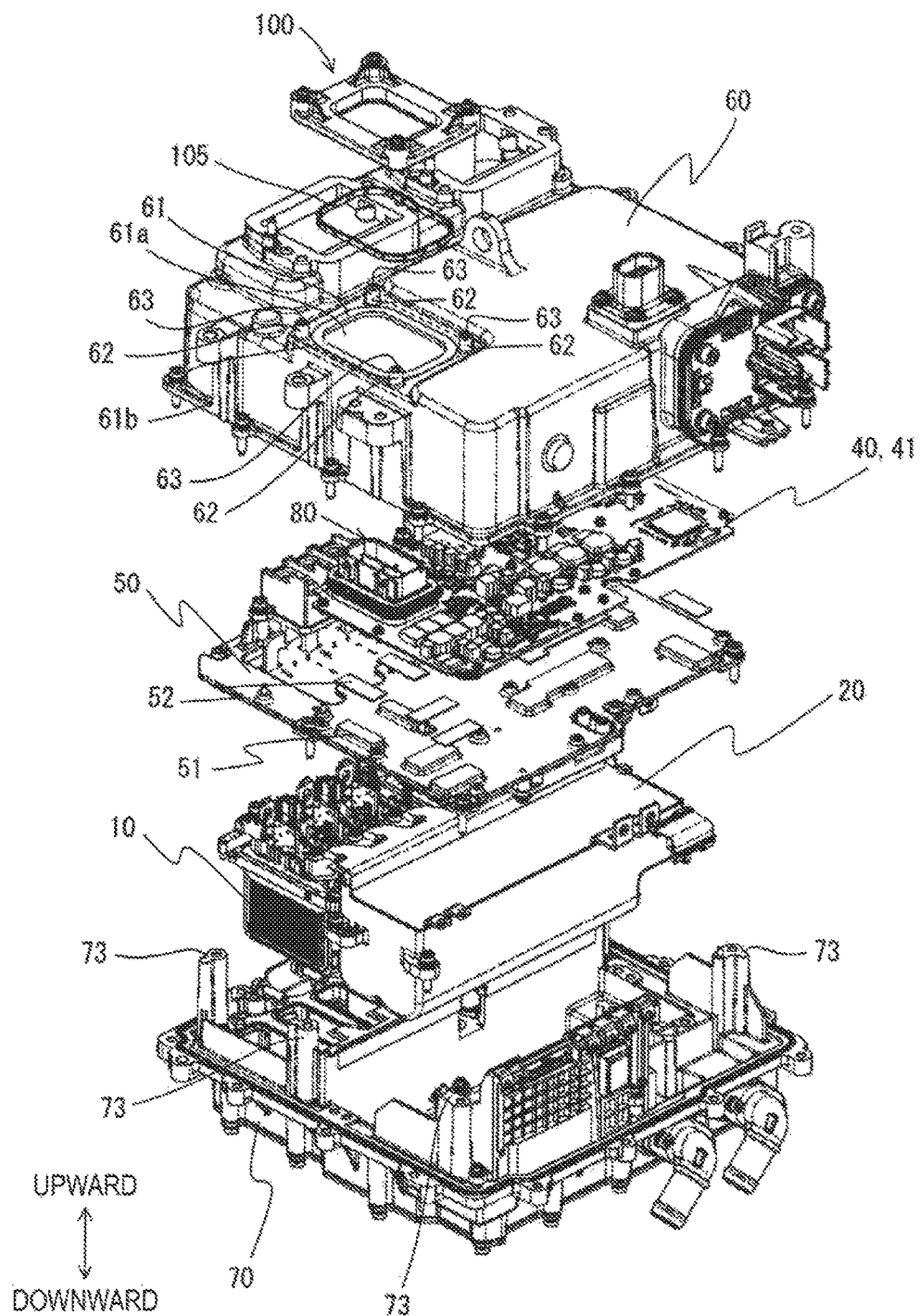
FIG. 2 is an exploded view of the power conversion apparatus.
Figure 3:
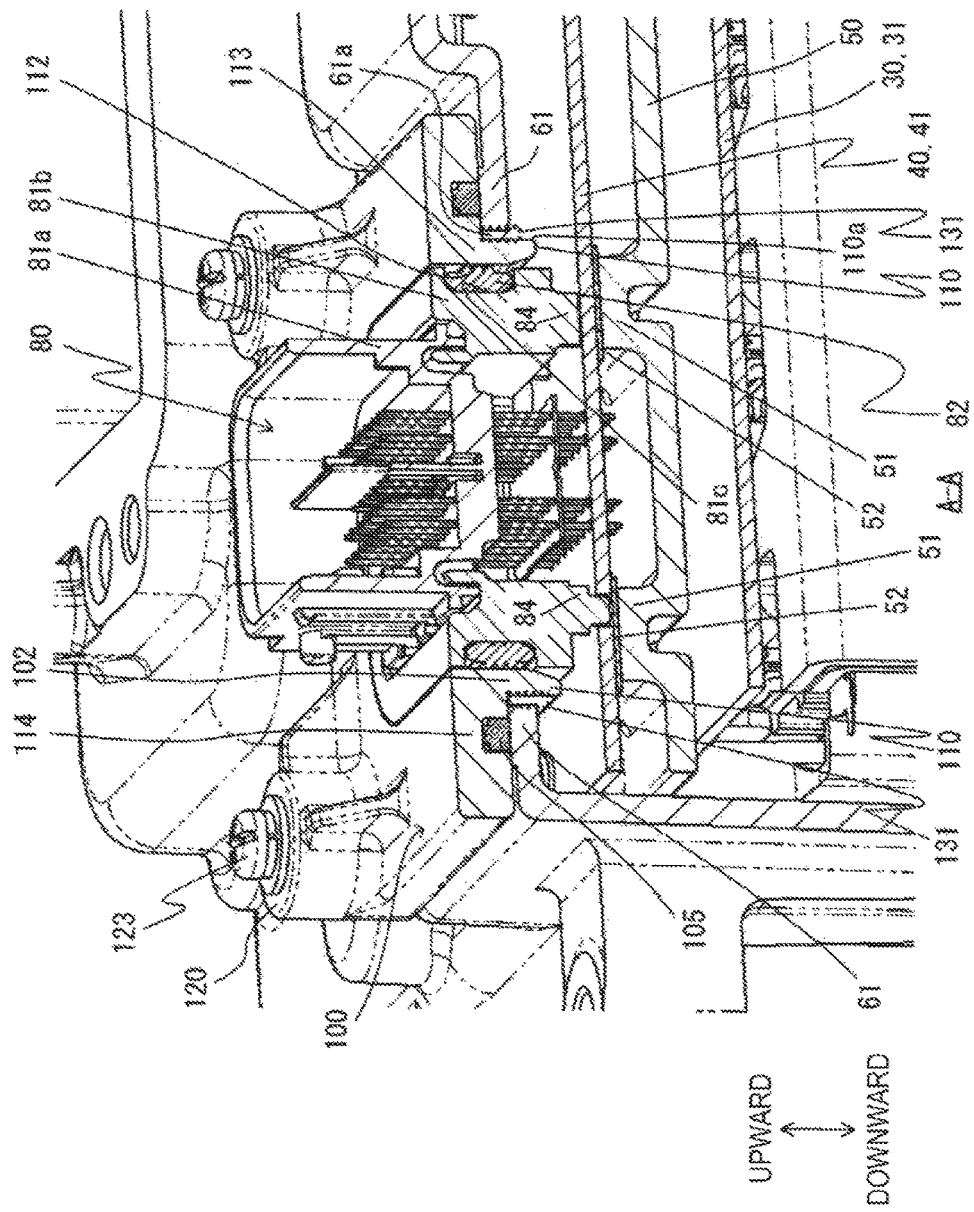
FIG. 3 is a perspective view of a cross section taken along plane A-A in FIG. 1.
Figure 4:
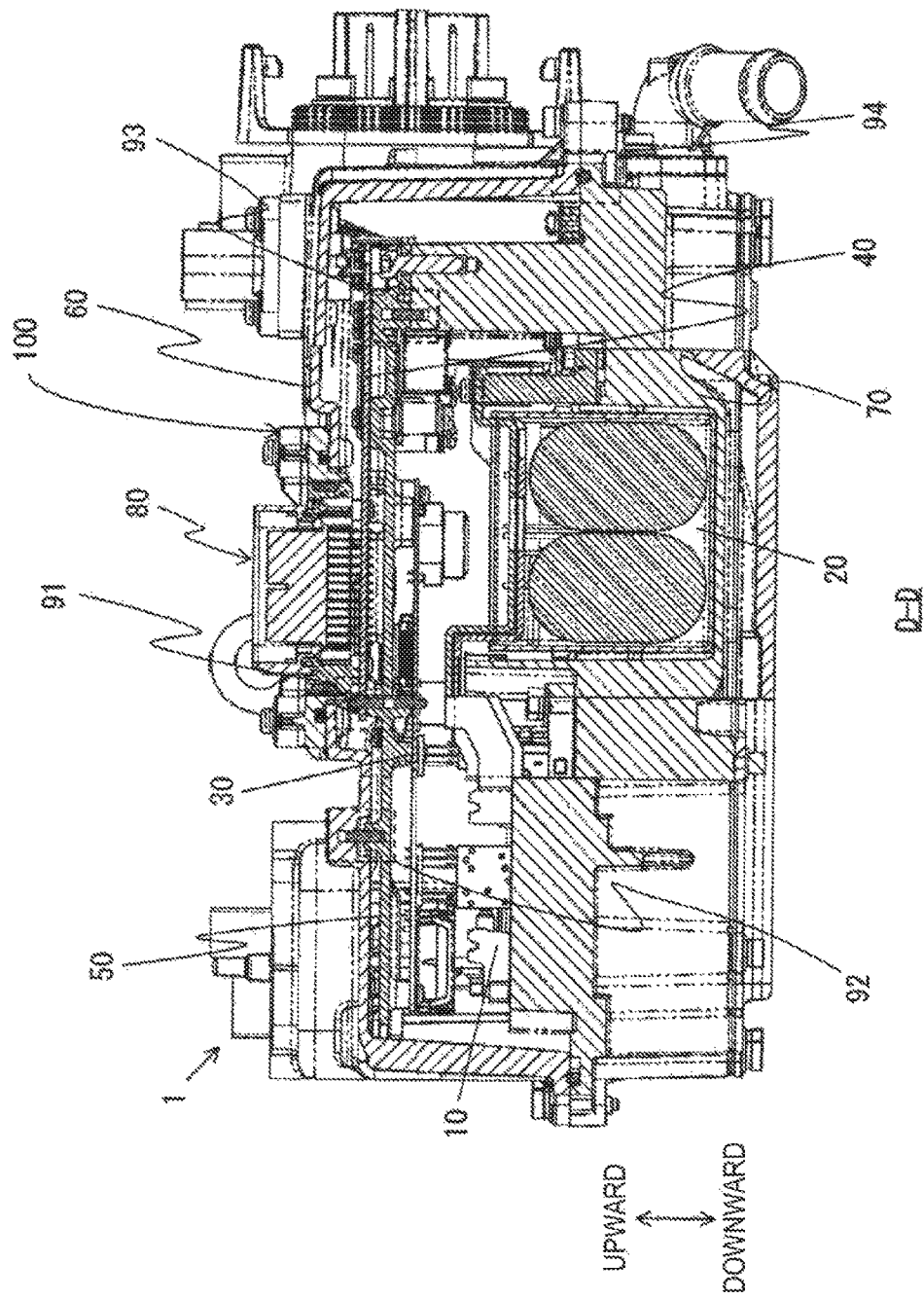
FIG. 4 is a cross-sectional view taken along plane D-D of FIG. 1.
Figure 5:
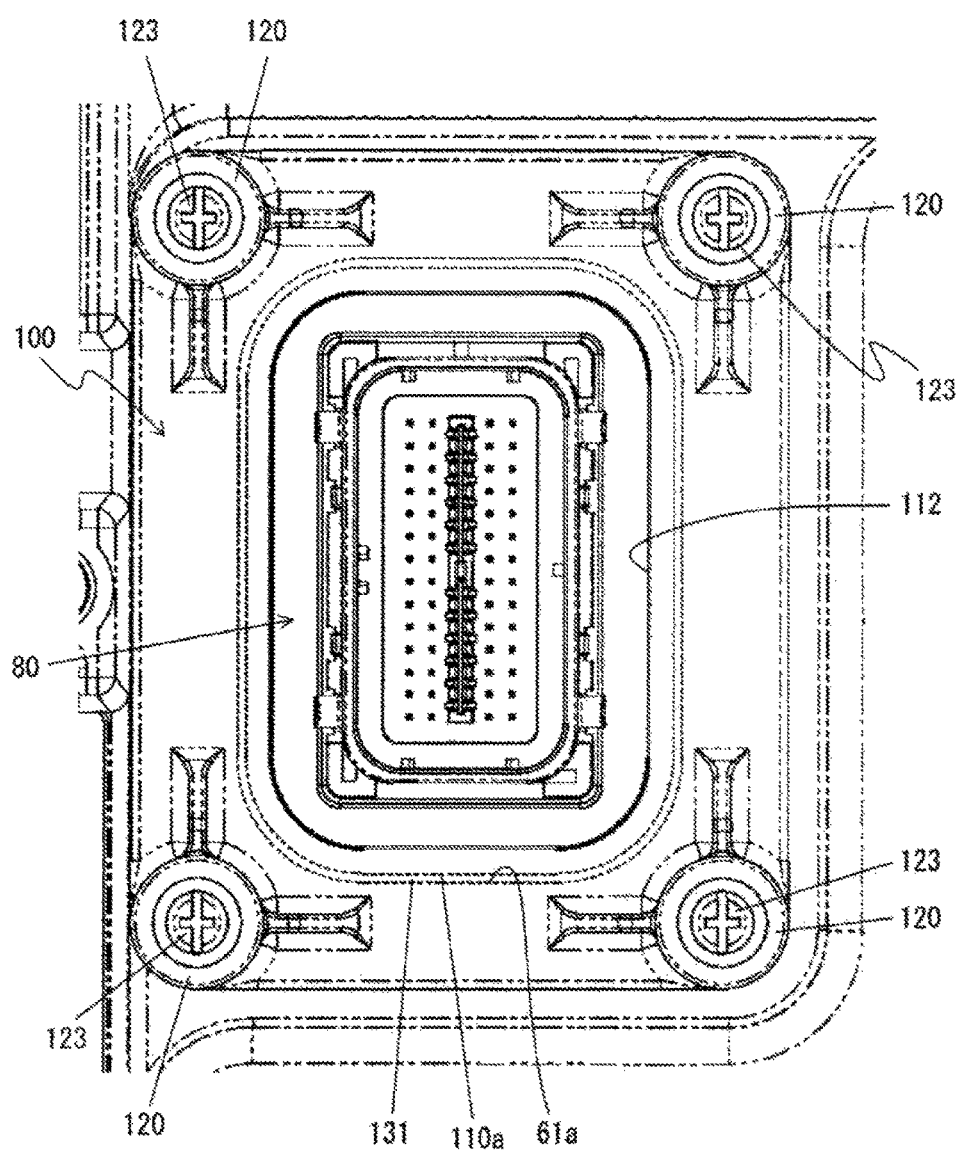
FIG. 5 is a top view of the vicinity of a signal connector.

FIG. 1 is a perspective view illustrating an appearance of a power conversion apparatus according to the present embodiment. FIG. 2 is an exploded view of the power conversion apparatus. FIG. 3 is a perspective view of a cross section taken along plane A-A in FIG. 1. FIG. 4 is a cross-sectional view taken along plane D-D of FIG. 1. FIG. 5 is a top view of the vicinity of a signal connector. For convenience of description, an up-down direction (upward/downward) of the power conversion apparatus is defined as illustrated in FIGS. 1 to 4.

A power conversion apparatus 1 converts a DC current supplied from a battery as a DC current power supply into an AC current and supplies the AC current to the rotating electric machine. Also, during regenerative operation, the rotating electric machine operates as a generator, and the power conversion apparatus 1 charges the battery by converting the AC current from the rotating electric machine into the DC current.

As illustrated in FIGS. 2 to 4, the power conversion apparatus 1 includes a power module 10, a capacitor module 20, a driver circuit substrate 30 (refer to FIGS. 3 and 4), a control circuit substrate 40, a substrate support member 50, and a first case 60 and a second case 70 constituting a housing storing these components.

The power module 10 includes a plurality of switching power semiconductors constituting an inverter circuit. In the present embodiment, an insulated gate bipolar transistor is used as the itching power semiconductor, which will be hereinafter abbreviated as an IGBT. Note that a metal oxide semiconductor field effect transistor may be used as the switching power semiconductor.

The control circuit substrate 40 includes a control circuit 41. The control circuit 41 includes a microcomputer that performs arithmetic processing of the switching timing of each of the IGBT. A target torque value demanded for a rotating electric machine (not illustrated) is input into the control circuit 41 from a host controller (not illustrated) via a signal connector 80 described below. On the basis of the target torque value input from the host controller, current information from a current sensor (not illustrated), and a magnetic pole position of a rotor of the rotating electric machine, the control circuit 41 generates a control pulse as a control signal for controlling each of the IGBT and inputs the pulse into a driver circuit 31 described below. Note that the magnetic pole position is detected on the basis of a detection signal output from rotating magnetic pole sensor such as a resolver provided in the rotating electric machine.

The driver circuit substrate 30 includes the driver circuit 31. On the basis of the control pulse from the control circuit 41, the driver circuit 31 supplies a drive pulse for controlling each of the IGBT to each of the IGBT via wires for gate drive signals. Each of the IGBT performs conduction or blocking operation on the basis of the drive pulse from the driver circuit 31 and converts the DC current into a three-phase AC current.

The first case 60 is member having a lidded and bottomless box shape, and includes an opening portion 61 on its upper surface (FIGS. 2 and 3). The signal connector 80 protrudes from an opening 61*a* of the opening portion 61 (FIGS. 1 and 3). In FIG. 2, a plane including an opening surface of the opening portion 61 is indicated by a broken line. This plane is referred to as an opening plane 61*b*. The opening plane 61*b* extends in a direction orthogonal to the up-down direction. On the periphery of the opening portion 61, four case-side bosses 62 protrude upward (FIG. 2). A female screw 63 is engraved on the case-side boss 62. As illustrated in FIGS. 1 and 3, an intermediate member 100 is attached on a portion of the upper surface of the first case 60 so as to cover the opening portion 61 using the four case-side bosses 62 as described in detail below. The intermediate member 100 includes an opening at the center, and the signal connector 80 passes through this central opening. Details of the signal connector 80 and the intermediate member 100 will be described below. The first case 60 forms a housing space to house the driver circuit substrate 30, the control circuit substrate 40, and the substrate support member 50. The second case 70 is attached to a lower portion of the first case 60.

As illustrated in FIG. 2 and FIG. 4, the second case 70 is a member having a bottomed uncovered box shape that houses a portion of the power module 10 and a portion of the capacitor module 20. The second case 70 includes a fixing portion (not illustrated) that fixes the power module 10, fixing portion (not illustrated) that fixes the capacitor module 20, and a fixing portion 73 that fixes the substrate support member 50. The fixing portion 73 protrudes more upward than an upper end of a peripheral wall of the second case 70.

As illustrated in FIGS. 2 to 4, the substrate support member 50 is a plate-like member to which the control circuit substrate 40 is attached on the upper surface and the driver circuit substrate 30 is attached to the lower surface. The substrate support member 50 is fixed to the fixing portion 73 of the second case 70. On an upper surface of the substrate support member 50, a substrate contact portion 51 protrudes at a position facing the connector-side substrate contact portion 84 of the signal connector 80 described below. When the control circuit substrate 40 is attached to the upper surface of the substrate support member 50, the substrate contact portion 51 abuts the lower surface of the control circuit substrate via a pressing force buffering material 52. The pressing force buffering material 52 is a soft plate-like member formed of rubber, for example, and is interposed between the substrate support member 50 and the control circuit substrate 40.

Figure 6:
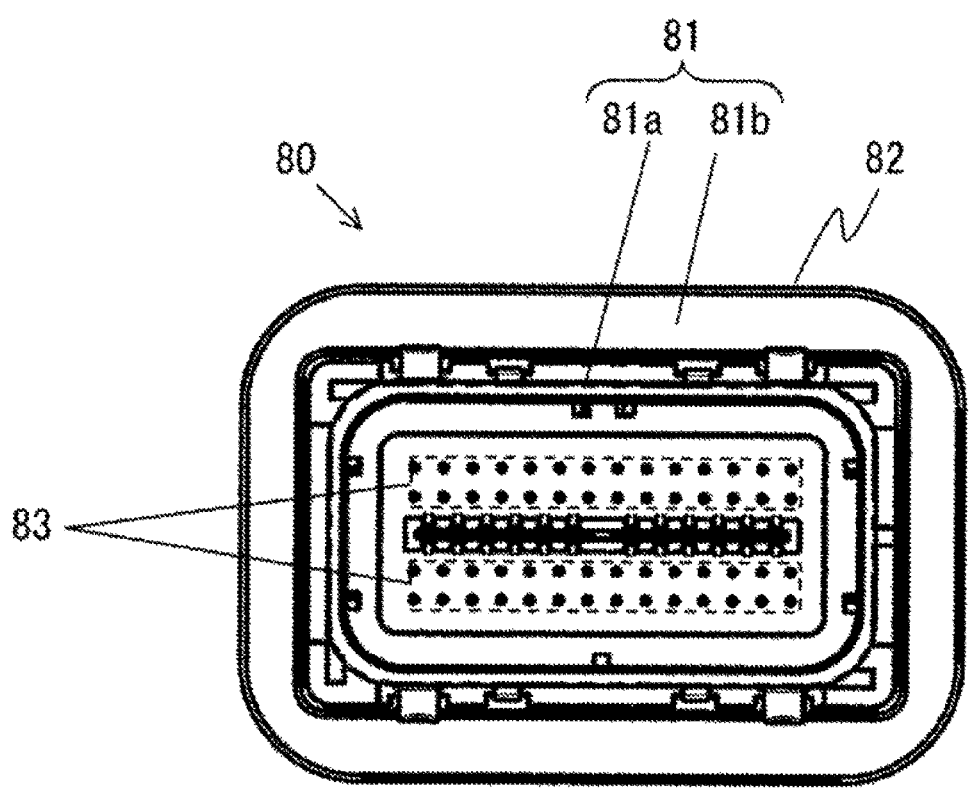
FIG. 6 is a plan view of the signal connector.
Figure 7:
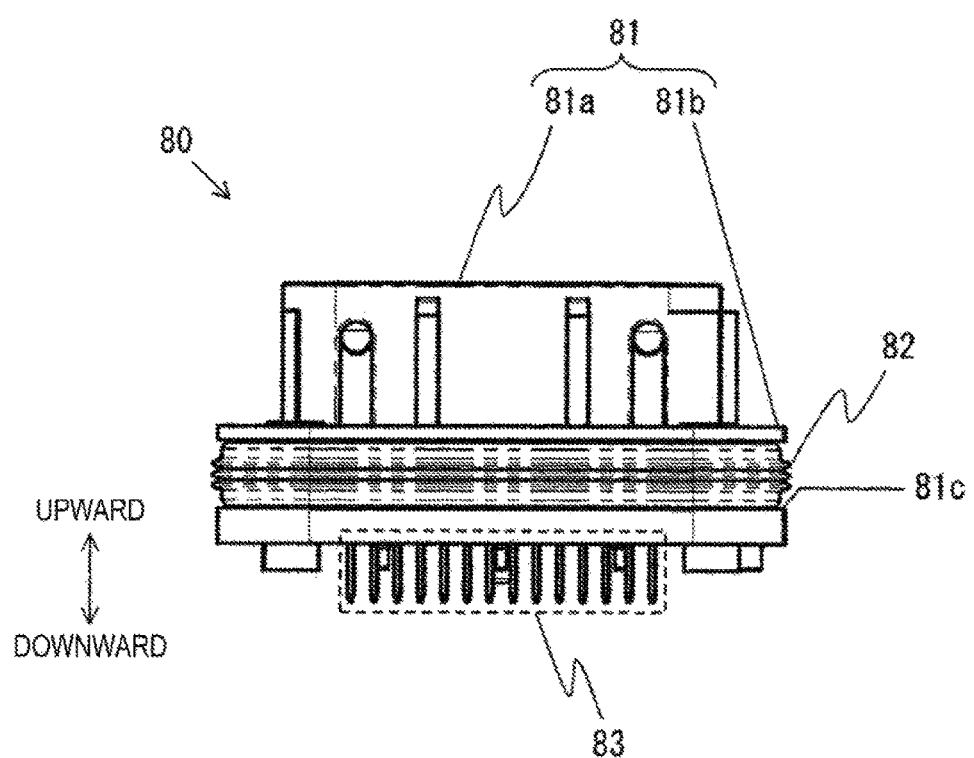
FIG. 7 is a side view of the signal connector.
Figure 8:
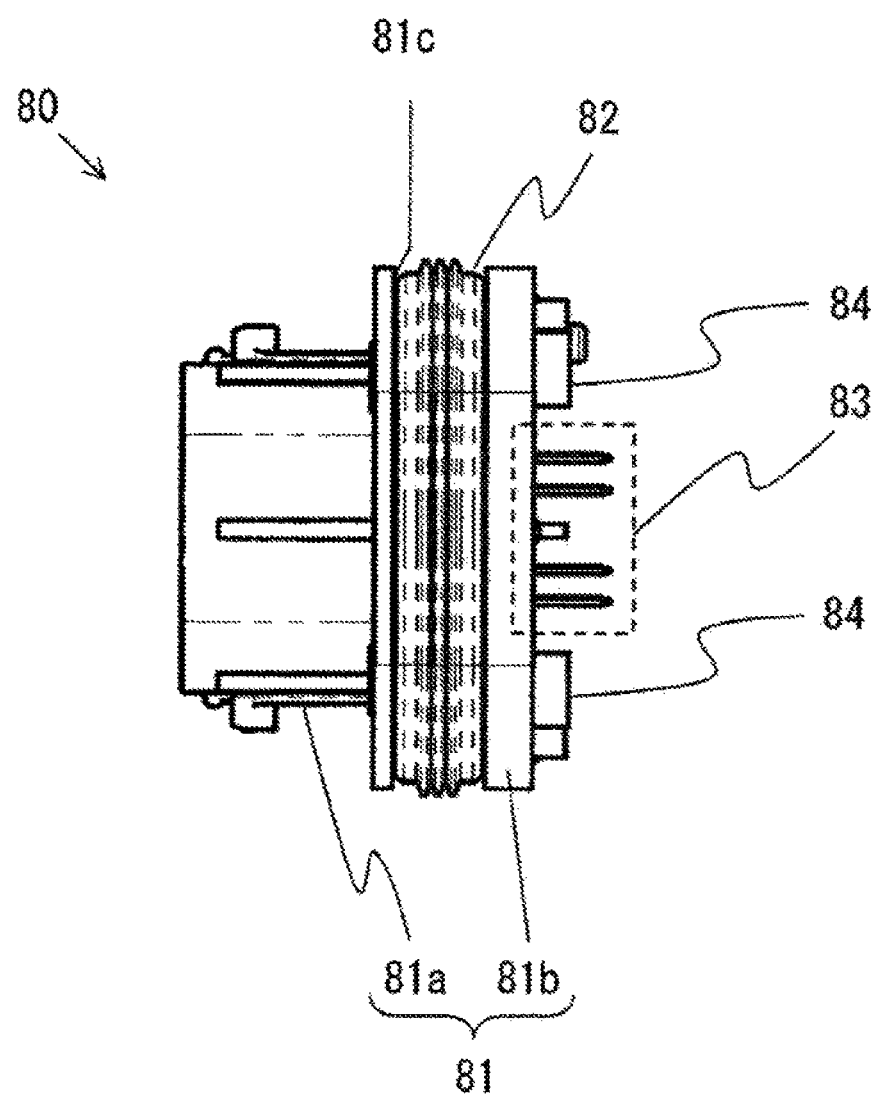
FIG. 8 is a side view of the signal connector.
Figure 9:
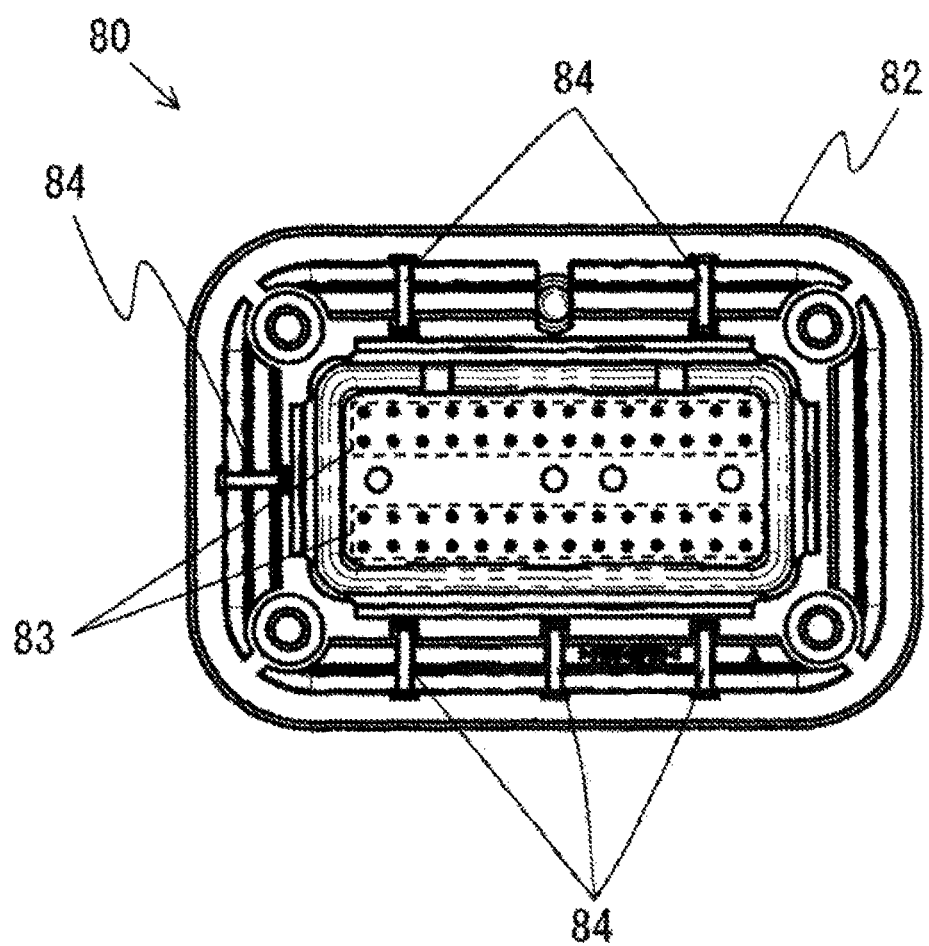
FIG. 9 is a bottom view of the signal connector.

The signal connector 80 illustrated in FIGS. 6 to 9 is attached on the upper surface of the control circuit substrate 40. FIG. 6 is a plan view of the signal connector 80, FIGS. 7 and 8 are side views of the signal connector 80, and FIG. 9 is a bottom view of the signal connector 80. The signal connector 80 is a connector to be connected to a host controller (not illustrated) as described above, and includes a connector main body 81, a seal member 82, a signal pin 83, and a connector-side substrate contact portion 84.

The connector main body 81 is a member that holds the signal pin 83, and is constituted with two members, an upper main body 81*a* and a lower main body 81*b* in the present embodiment. The upper main body 81*a* has a substantially rectangular shape in plan view and is fitted and connected to an external connection member 89 illustrated in FIG. 1. As illustrated in FIGS. 3, 7, and 8, the lower main body 81*b* includes a groove 81*c* along the entire circumference of its outer periphery. A ring-shaped seal member 82 is fitted in the groove 81*c*. When the signal connector 80 is connected to the external connection member 89, the signal pin transmits a signal between the control circuit 41 and a host controller (not illustrated). The signal pin 83 is held by the connector main body 81, with its lower end being connected and fixed to the control circuit substrate 40 by solder or the like. In this manner, the signal connector 80 is fixed to the control circuit substrate 40. The connector-side substrate contact portion 84 is a portion that abuts the upper surface of the circuit substrate 40, and is formed on the lower surface of the connector main body 81. The connector-side substrate contact portion 84 is provided at a position facing the substrate contact portion 51 of the substrate support member 50. When pressing and fitting the external connection member 89 into the upper main body 81*a* of the connector main body 81, the connector-side substrate contact portion 84 transmits a downward force acting on the signal connector 80 to the substrate contact portion 51 of the substrate support member 50 via the circuit substrate 40 and the pressing force buffering material 52.

Figure 10:
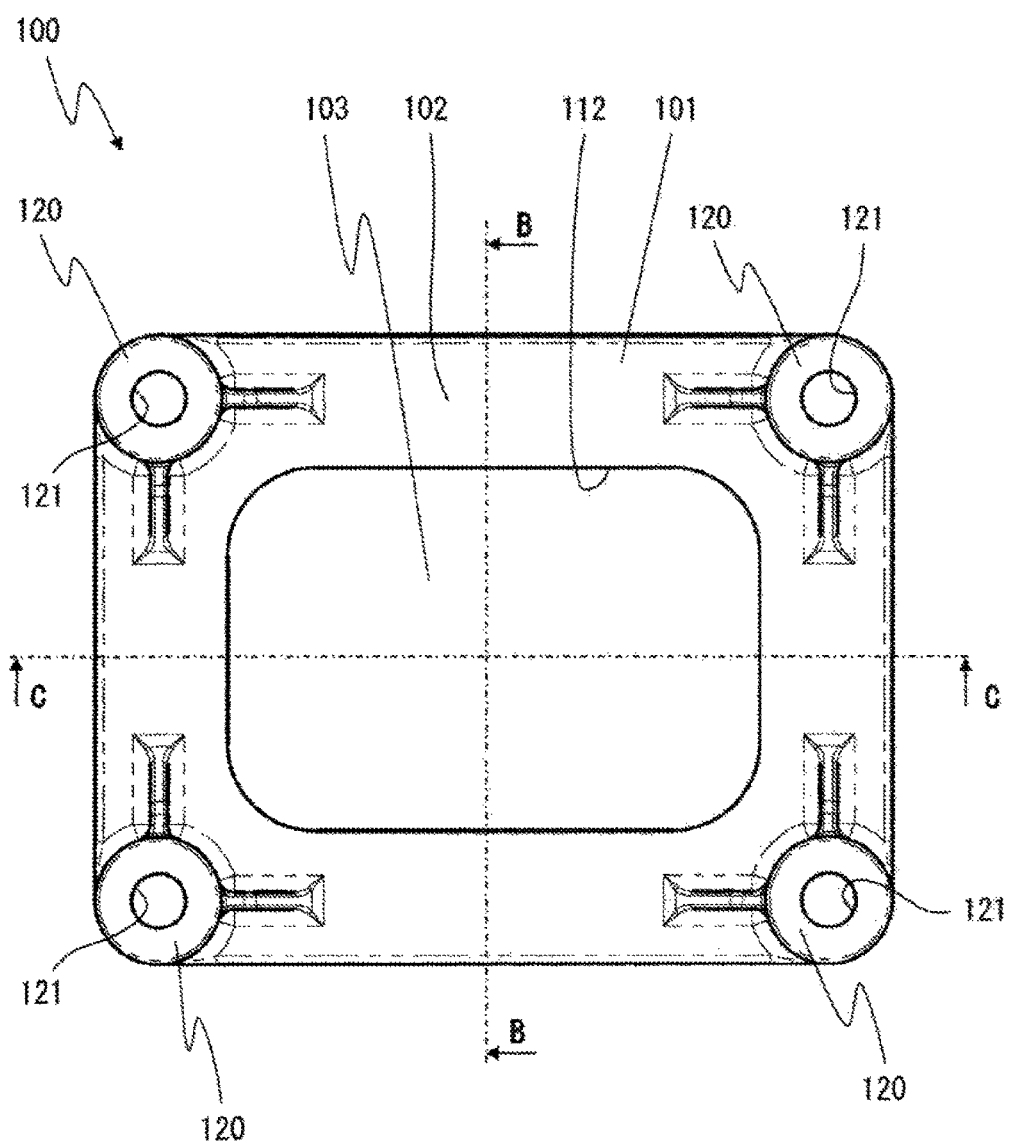
FIG. 10 is a plan view of an intermediate member.
Figure 11:
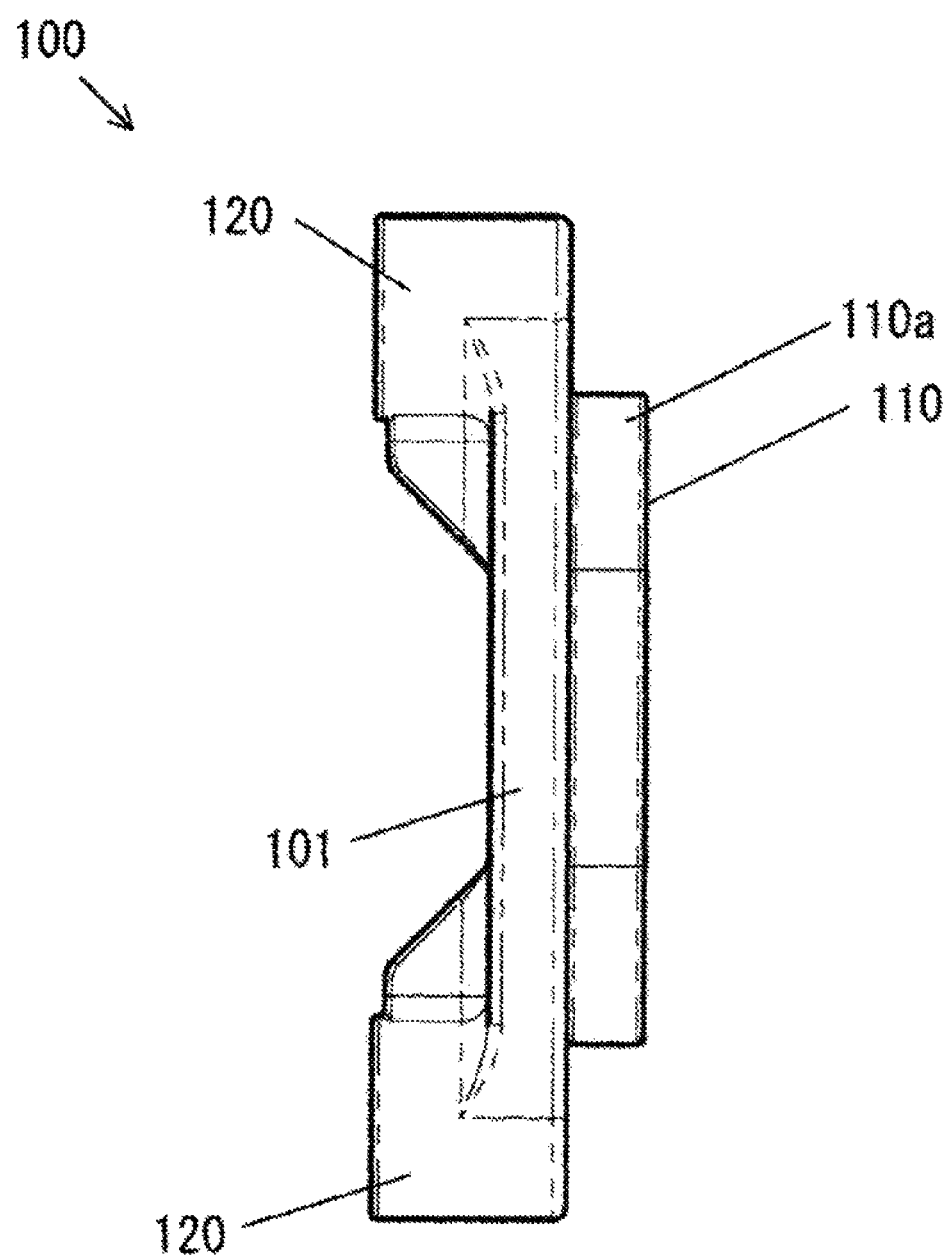
FIG. 11 is a side view of the intermediate member.
Figure 12:
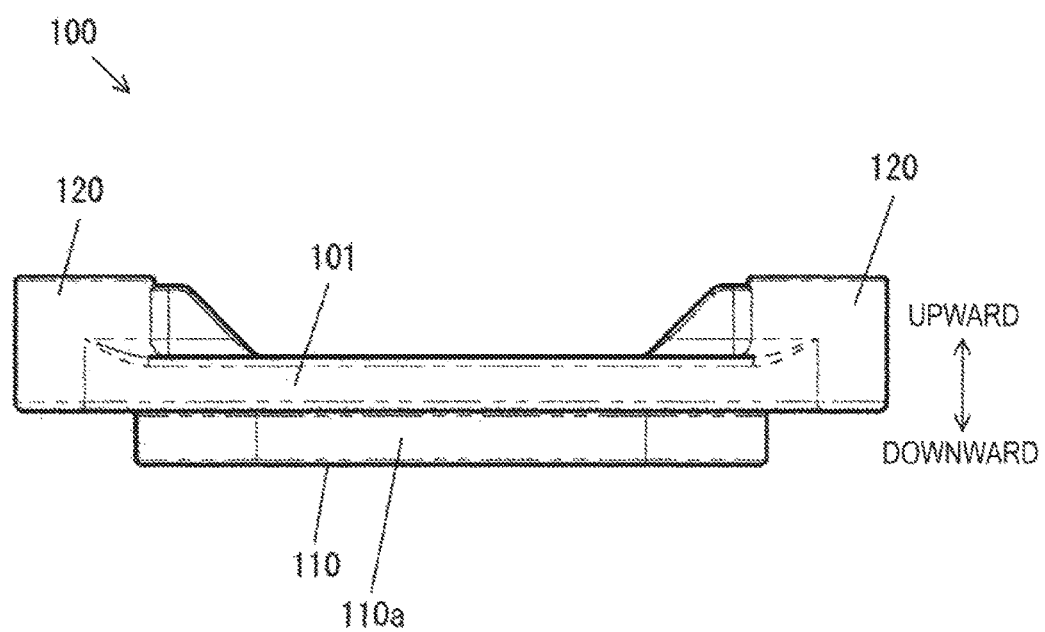
FIG. 12 is a side view of the intermediate member.
Figure 13:
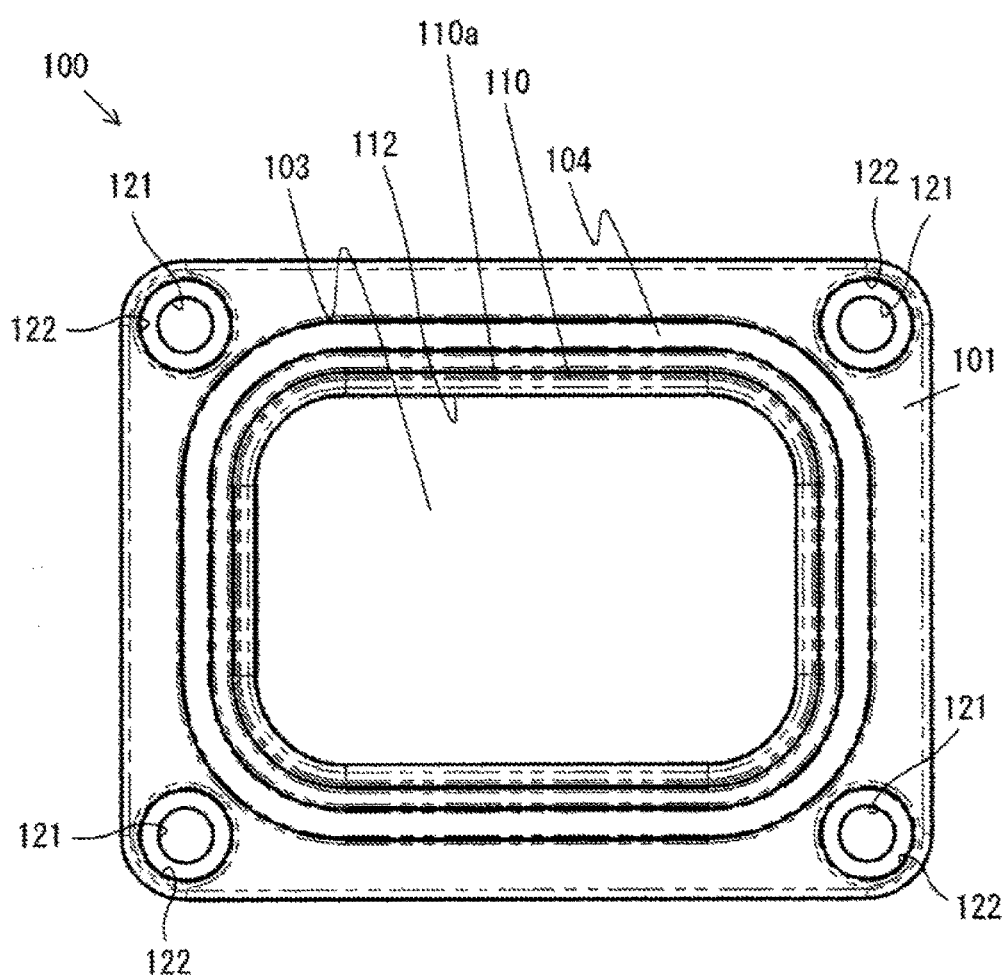
FIG. 13 is a bottom view of the intermediate member.
Figure 14:
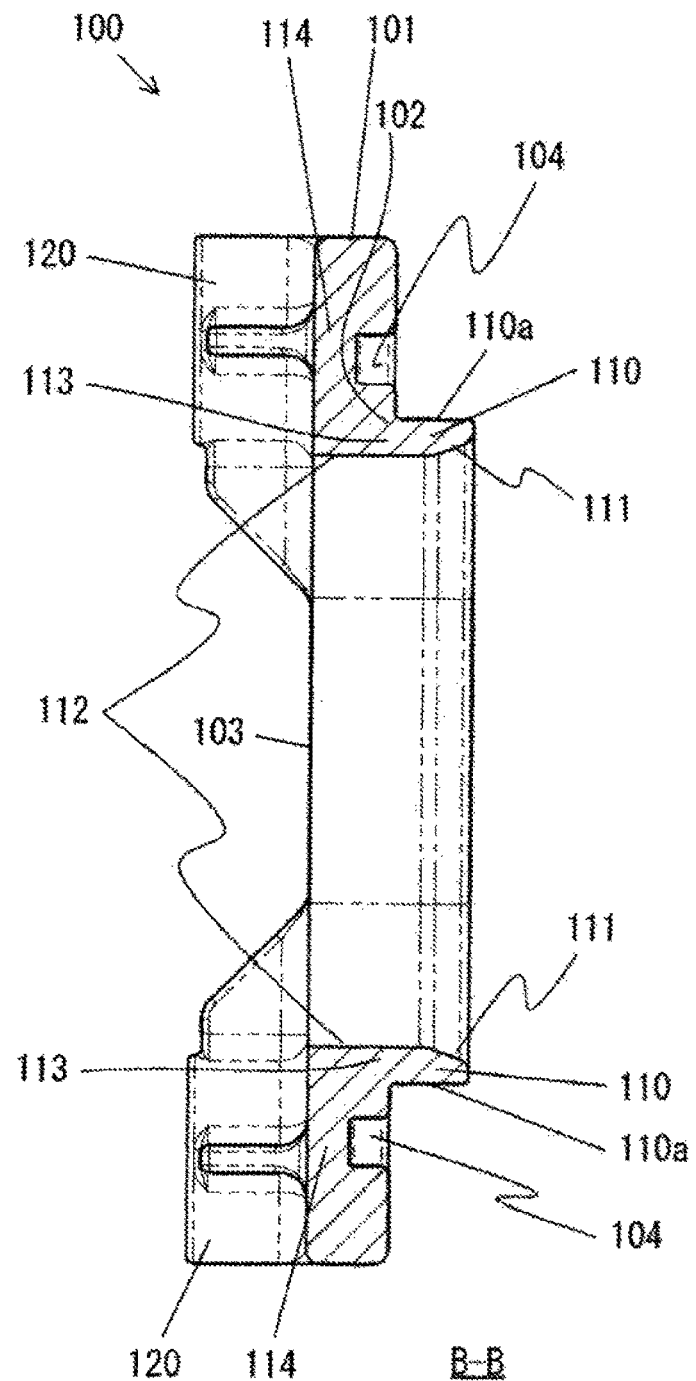
FIG. 14 is a cross-sectional view taken along arrow B-B in FIG. 9.
Figure 15:
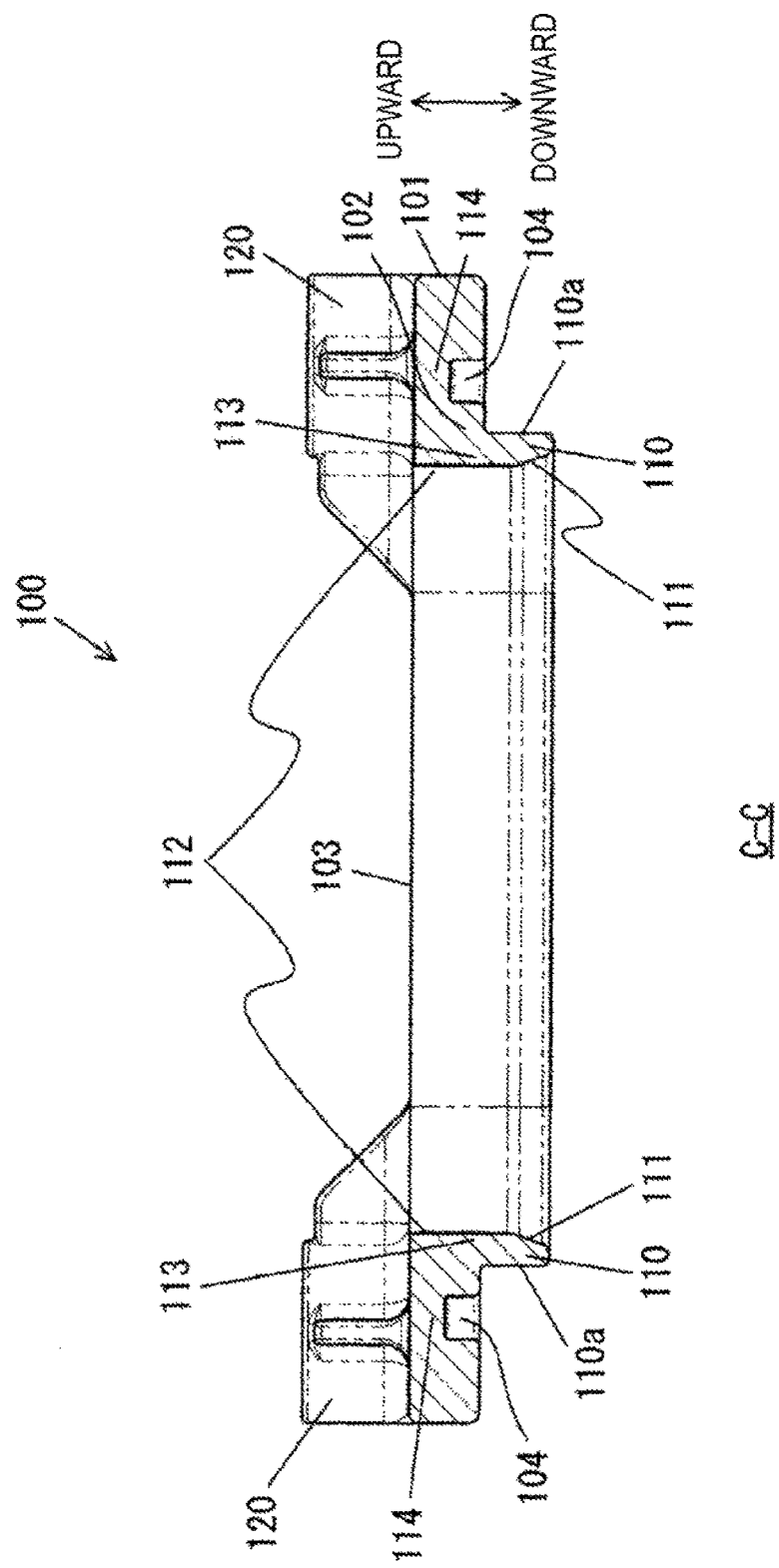
FIG. 15 is a cross-sectional view taken along arrow C-C in FIG. 10.

FIG. 10 is a plan view of the intermediate member 100. FIGS. 11 and 12 are side views of the intermediate member 100. FIG. 13 is a bottom view of the intermediate member 100. FIG. 14 is a cross-sectional view taken along arrow B-B in FIG. 9. FIG. 15 is a cross sectional view taken along arrow C-C in FIG. 10. The intermediate member 100 is a member that closes a gap between the opening portion 61 of the first case 60 and the signal connector 80. The intermediate member 100 includes an intermediate member main body 101. The intermediate member main body 101 is a plate-like member having a substantially rectangular shape in plan view, and includes a connector-side opening forming portion 102, an insertion portion 110, and a fixing portion 120. The connector-side opening forming portion 102 includes an opening 103 of a substantially rectangular shape formed on the intermediate member main body 101 at the center in plan view. The opening 103 is an opening through which the signal connector 80 passes. The insertion portion 110 is protruded from the lower surface of the connector-side opening forming portion 102.

As clearly illustrated in FIGS. 11, 12, 14, and 15, the insertion portion 110 is a rectangular ring-shaped portion protruding downward from the intermediate member main body 101. An outer peripheral portion of the insertion portion 110 is referred to as an outer peripheral portion 110*a*. When the intermediate member 100 is attached to the first case 60, the insertion portion 110 is inserted through the opening 61*a* of the opening portion 61 of the first case 60. That is, the diameter of the outer peripheral portion 110*a* of the insertion portion 110 is smaller than the diameter of the opening 61*a* of the opening portion 61 the first case 60 by a predetermined gap. This gap will be described in detail below.

In plan view, the insertion portion 110 includes: an upper inner peripheral portion connected to t e connector-side opening forming portion 102 and having a same inner diameter as the inner periphery of the connector-side opening forming portion 102; and a tapered portion 111 having an increased inner diameter more toward a lower side from the upper inner peripheral portion. The connector-side opening forming portion 102 and the upper inner peripheral portion of the insertion portion 110 constitute a first seal portion 113 that seals between the signal connector 80 and the first case 60, together with the seal member 82 of the signal connector 80, as will be described below. The inner peripheral surface of the first seal portion 113 forms a first seal surface 112 that abuts the seal member 82. Since the first seal portion 113 is formed in the connector-side opening forming portion 102 and the upper inner peripheral portion of the insertion portion 110 in this manner, it is possible to ensure a sufficiently large distance of the first seal surface 112 of the first seal portion 113 in the up-down direction.

Figure 16:
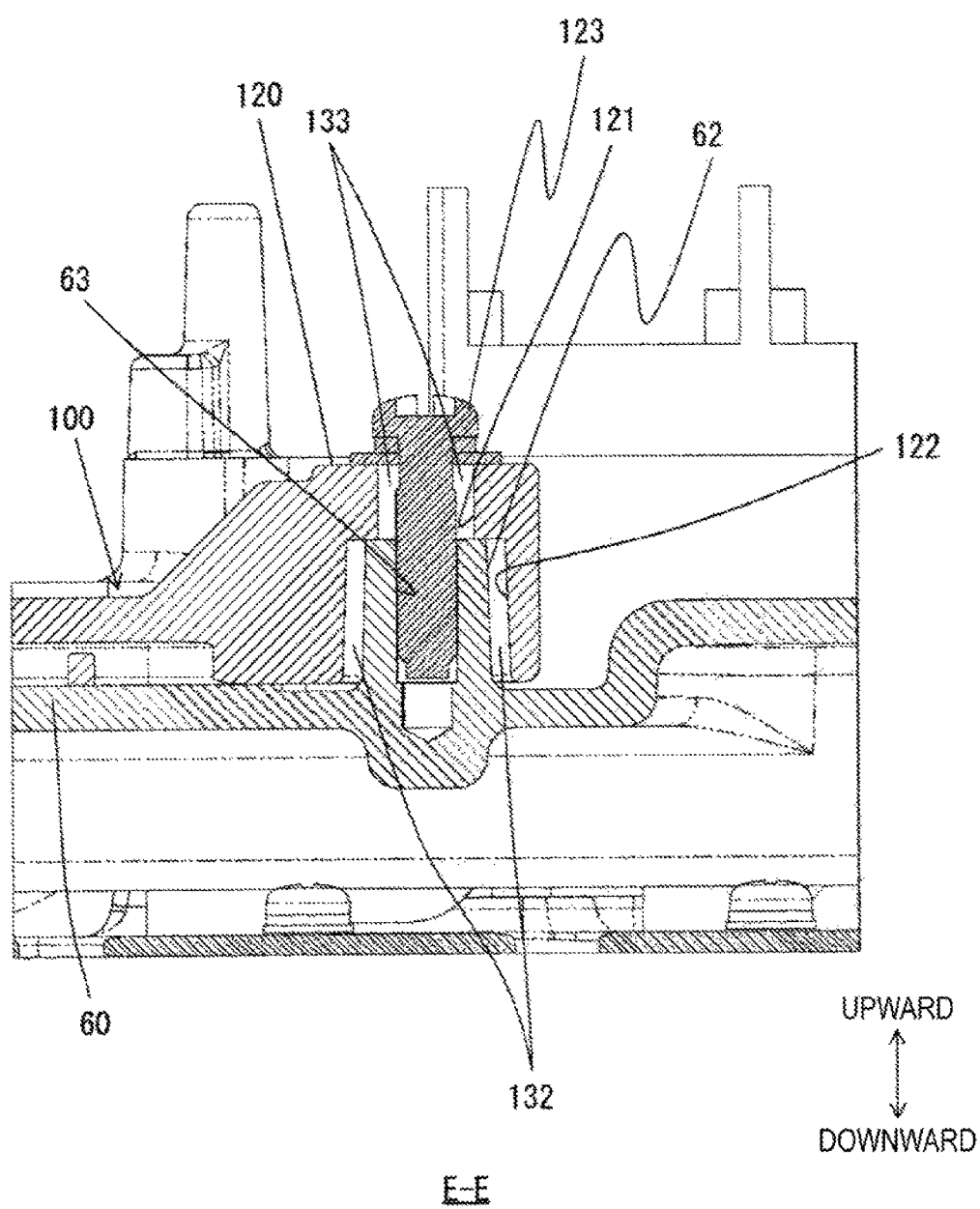
FIG. 16 is a cross-sectional view taken along plane E-E in FIG. 1.

The fixing portion 120 is provided at four corners of the intermediate member main body 101 in plan view. Together with the case-side boss 62, the fixing portion 120 fixes the intermediate member 100 to the first case 60. As is apparent from FIGS. 10 and 16, the fixing portion 120 has a cylindrical shape having a stepped hole. Note that FIG. 16 is a cross-sectional view taken along plane E-E in FIG. 1, and illustrates a vertical cross section of the fixing portion 120. The inner diameter of the stepped hole of the fixing portion 120 is larger in a lower hole 122 than in an upper hole 121. The inner diameter of the upper hole 121 is smaller than the outer diameter of the case-side boss 62 of the first case 60, while the inner diameter of the lower hole 122 is larger than the outer diameter of the case-side boss 52. The inner peripheral surface of the hole 122 faces the outer peripheral surface of the case-side boss 62. Therefore, the hole 122 is also referred to as a boss facing portion.

As illustrated in FIGS. 13 to 15, a seal groove 104 is provided on a lower surface of the intermediate member main body 101. The seal groove 104 is provided outside the outer peripheral portion 110a of the insertion portion 110 in plan view. A seal member 105 illustrated in FIG. 2 is inserted into the seal groove 104. A portion where the seal groove 104 is formed is referred to as a second seal portion 114. When the intermediate member 100 is attached to the first case 60, the second seal portion 114 seals between the signal connector 80 and the first case 60, together with the seal member 105.

Assembling Power Conversion Apparatus 1

Referring mainly to FIG. 2, assembly of the power conversion apparatus 1 according to the present embodiment will be described. First, the power module 10 and the capacitor module 20 are individually housed in and fixed to the second case 70. With this operation, the power module 10 and the capacitor module 20 are arranged side by side.

The driver circuit substrate 30 is attached on the lower surface the substrate support member 50 and the control circuit substrate 40 is attached to the upper surface thereof, in advance. Subsequently, the substrate support member 50 is fixed to the fixing portion 73 of the second case 70. With this operation, the driver circuit substrate 30 and the control circuit substrate 40 are fixed to the second case 70 via the substrate support member 50. The driver circuit substrate 30, the control circuit substrate 40, and the substrate support member 50 are arranged above the power module 10 and the capacitor module 20. Note that the signal connector 80 is attached to the control circuit substrate 40 in advance. Moreover, the pressing force buffering material 52 is arranged between the substrate contact portion 51 of the substrate support member 50 and the lower surface of the control circuit substrate 40.

The control circuit substrate 40 may be attached to the substrate support member 50 after fixing the substrate support member 50 to the fixing portion 73 of the second case 70.

Next, the first case 60 attached to the second case 70. That is, the second case 70 and the first case 60 are arranged to face each other, and the individual peripheral wall portions are fastened with bolts. When the first case 6 is attached to the second case 70, the signal connector 80 protrudes from the opening 61a of the opening portion 61 of the first case 60. In this state, a gap is formed between the opening portion 61 and the outer periphery of the signal connector 80.

Next, a method of attaching the intermediate member 100 to the first case 50 will be described. First, along operation of lowering the intermediate member 100 with the seal member 105 inserted in the seal groove 104 from above the opening portion 61, the intermediate member 100 is guided by the outer periphery of the connector main body 81 of the signal connector 80 and by the tapered portion 111 of the insertion portion 110 of the intermediate member 100. Subsequently, the connector main body 81 of the signal connector 80 inserted into the opening 103 of the intermediate member main body 101. That is, in the process of inserting the connector main body 81 into the opening 103 of the intermediate member 100, the intermediate member 100 moves parallel to the opening plane 61b in accordance with the signal connector 80 the action of the tapered portion 111 of the insertion portion 110, determining the position in plan view.

When the connector main body 81 of the signal connector 80 is inserted into the opening 103 of the intermediate member main body 101, the first seal surface 112 abuts the outer periphery of the seal member 82 of the signal connector 80 and pressurises the seal member 82. With this operation, gap between first seal surface 112 and the outer periphery of the connector main body 31 is sealed.

By further lowering the intermediate member 100, the insertion portion 110 is inserted into the opening 61a of the opening portion 61.

By still further lowering the intermediate member 100, the case side boss 62 of the first case 60 enters the lower hole 122 of the fixing portion 120 of the intermediate member 100. Subsequently, a lower surface of the step portion of the upper hole 121 and the lower hole 122 of the fixing portion 120 abuts an upper end of the case-side boss 62 refer to FIG. 16). Moreover, the lower surface of the seal member 105 abuts the upper surface of the opening portion 61 and is pressurized. With this operation, the space between the lower surface of the intermediate member main body 101 and the upper surface of the opening portion 61 is sealed (refer to FIG. 3). When the intermediate member 100 is attached, the signal connector 80 protrudes from the opening 103 (refer to FIGS. 1 and 3).

As illustrated in FIGS. 3, 5, and 16, the fixing portion 120 is fixed to the case-side boss 62 with a bolt 123, on the intermediate member 100. When the bolt 123 screwed into the female screw 63 engraved on the case-side boss 62, the bolt 123 pressurizes the upper surface of the fixing portion 120 downward is the washer, presses the fixing portion 120 against the upper end of the case-side boss 62, thereby fixing the intermediate member 100 to the first case 60. In this manner, the power conversion apparatus is assembled.

Next, a positioning method or each of the members of the power conversion apparatus 1 assembled in this manner will be described. As illustrated in FIG. 4, in a state where the power conversion apparatus 1 is assembled, control circuit substrate 40 and the substrate support member 50 are positioned by a first positioning portion 91 surrounded a broken line, while the first case 60 and the substrate support member 50 are positioned by a second positioning portion 92 surrounded by a broken line. The substrate support member 50 and the second case 70 are positioned by a third positioning portion 93 surrounded by a broken line, while the first case 60 and the second case are positioned by a fourth positioning portion 94 surrounded by a broken line There. In the first positioning portion 91, a positioning pin is inserted through a positioning hole provided in the control circuit substrate 40 and the substrate support member 50. In the second positioning portion 92, a positioning pin is inserted through a positioning hole provided in the first case 60 and substrate support member 50. In the third positioning portion 3 a positioning pin is inserted through a positioning hole provided the substrate support member 50 and the second case 70. In the fourth positioning portion 94, positioning pin is inserted through a positioning hole provided in the first case 60 and the second case 70.

As described above, the power conversion apparatus configured in this manner is mounted on an electric vehicle. As described above, the signal connector 80 is connected to the external connection member 89 (refer to FIG. 1) in order to connect the host controller (not illustrated) and the control circuit 41. When the external connection member 89 is connected to the signal connector 80, a downward pressurizing force acts on the signal connector 80 from the external connection member 89. As illustrated in FIG. 3, however, since the signal connector 80: is supported by the substrate contact portion 51 via the control circuit substrate 40 and the pressing force buffering material 52, the pressing force buffering material 52 absorbs the pressurizing force acting on the signal connector 80, and the substrate contact portion 51 distributes the pressurizing force acting on the signal connector 80 to the substrate support member 50 and the second case 70.

Note that, when attaching the intermediate member 100, the signal connector 80 receives downward pressurizing force from the intermediate member 100 due to the friction between the first seal surface 112 of the intermediate member 100 and the seal member 82 of the signal connector 80. Similarly to the above-described case, however, the pressing force buffering material 52 absorbs the pressurizing force acting on the signal connector 80, and the substrate contact portion distributes the pressurizing force acting on the signal connector 80 to the substrate support member 50 and the second case 70. This configuration makes it possible to prevent damage to the connection portion due to solder or the like between the signal pin 83 and the control circuit substrate 40 attributed to the pressurizing force acting on the signal connector 80.

Positional Tolerance Between Opening 61a of the Opening Portion 61 and Signal Connector 80

The control circuit substrate 40 to which the signal connector 80 has been attached is fixed to the second case 70 via the substrate support member 50. Moreover, the first case 50 is fixed to the second case 70 to which the control circuit substrate 40 has been fixed. This generates variation in a positional relationship between the signal connector 80 and the opening 61a of the opening portion 61 in plan view. In the following description, the variation in the positional relationship between the signal connector 80 and the opening 61a of the opening portion 61 in plan view will be referred to as a positional tolerance between the signal connector 80 and the opening 61a of the opening portion 61, or simply a positional tolerance. In the following, this positional tolerance will be described in two manners.

Figure 17:
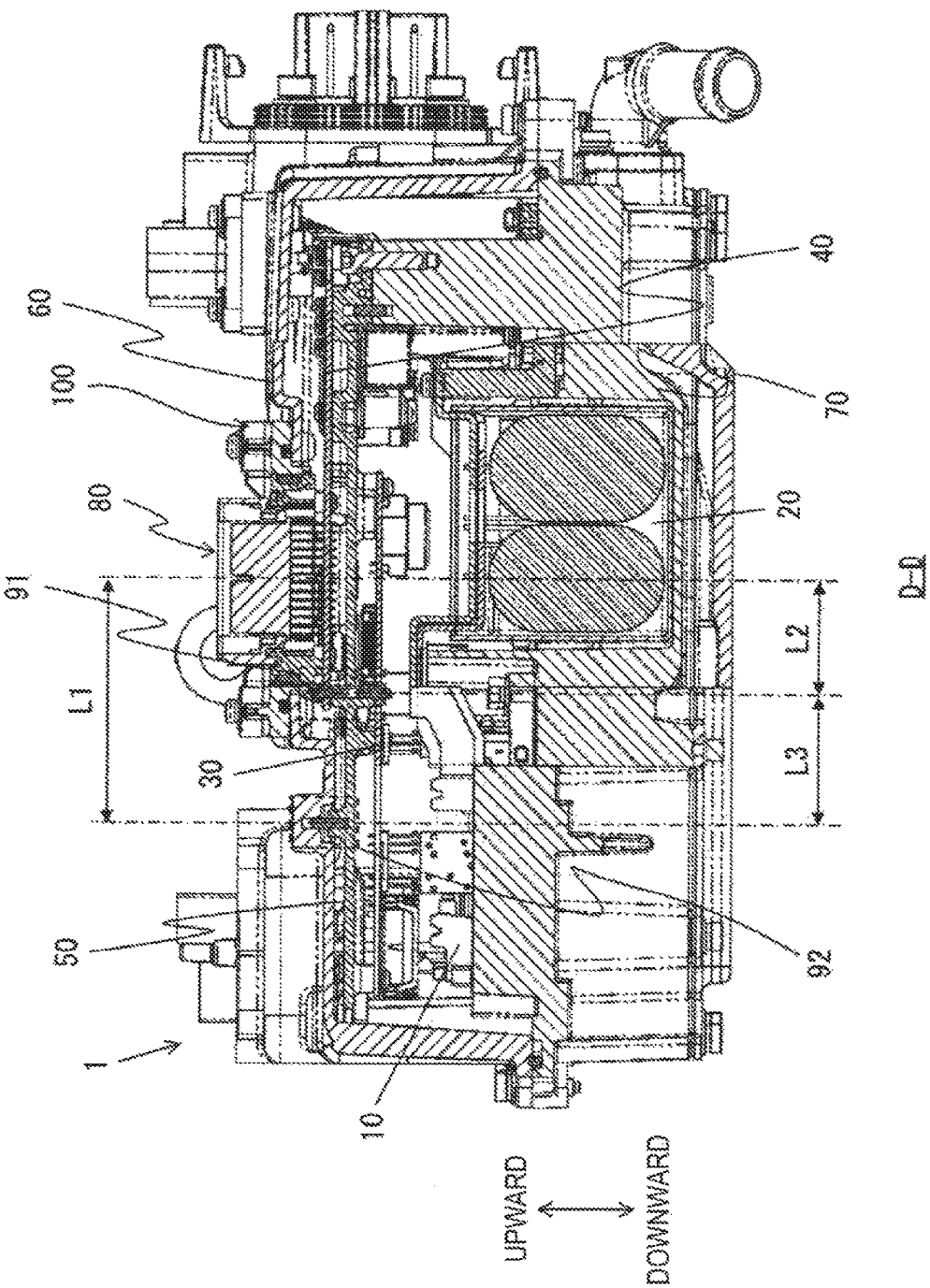
FIG. 17 is cross-sectional view taken along plane D-D plane in FIG. 1.

(1) With reference to FIG. 17, the positional tolerance in a case where focusing is on the dimensions of individual portions in the first case 60, the substrate support member 50, and in the control circuit substrate 40, and focusing on the first and second positioning portions 91 and 92 will be described. FIG. 17 is a cross-sectional view taken along plane D-D in FIG. 1. The dimension from the second positioning portion 92 of the first case 60 to the center of the opening 61a of the opening portion 61 of the first case 60 defined as a dimension L1, the dimension from the center position of the signal connector 80 on the control circuit substrate 40 to the first positioning portion 91 is defined as a dimension L2, and the dimension from the first positioning portion 91 to the second positioning portion 92 on the substrate support member 50 is defined as a dimension L3.

In a case where the dimensional tolerances of the dimensions L1 to L3 are zero in individual cases, the dimension L1 would be equal to the sum of the dimension L2 and the dimension L3. That is, the following formula (1) would be established.

$$L1-(L2+L3)=0 \qquad (1)$$

Actually, since the dimensional tolerances of the dimensions L1 to L3 are not, zero, the above-described formula (1) is to be expressed r the following formula (2).

$$L1 - (L2 + L3) = 0 + A \qquad (2)$$
$$= A$$

Herein, A is the sum of dimensional tolerances of dimensions L1 to L3 in a positive or negative value.

Moreover there between the control circuit substrate 40 and the substrate support member 50 in the first positioning portion 91, while there is play between the first case 60 and the substrate support member 50 in the second positioning portion 92. The sum of the plays between the control circuit substrate 40 and the substrate support member 50 in the first positioning portion 91 and the play between the first case 60 and the substrate support member 50 in the second positioning portion 92 is represented by B. The sun B of the play is a positive or negative value.

The positional tolerance between the signal connector 80 and the opening 61a of the opening portion 61 is the sum of the value A represented by the above-described formula (2) and the above-described sum B of the plays, and expressed by the following formula (3).

$$(\text{Positional tolerance})=A+B \qquad (3)$$

(2) With reference to FIG. 18, the positional tolerance in a case where focusing is on the dimensions of individual portions the second case 70, the substrate support member 50, and in the control circuit substrate 40, and focusing on the first, third, and fourth positioning positions 91, 93, and 94 will be described. FIG. 18 a cross-sectional view taken along plane D-D in FIG. 1. The dimension from the first positioning portion 91 to the third positioning portion 93 on the substrate support member 50 is defined as a dimension L4, the dimension from the third positioning portion 93 to the fourth positioning portion 94 in the second case 70 is defined as a dimension L5, and the dimension from the fourth positioning portion 94 to the center of the opening 61a of the opening portion 61 in the first case 60 is defined as a dimension L6.

In case where the dimensional tolerances of the dimensions L2, and L4 to L6 are zero in individual cases, the dimension L6 would be equal to the dimension obtained by subtracting the dimension L2 from the sum of the dimension L4 and the dimension L5. That is, the following formula (4) would be established.

$$L6-(L4+L5-L2)=0 \quad (4)$$

Actually, since the dimensional tolerances of the dimensions L2, and L4 to L6 are not zero, the above-described formula (4) is to be expressed by the following formula (5).

$$L6 - (L4 + L5 - L2) = 0 + C \quad (5)$$
$$= C$$

Herein, C is a sum of dimensional tolerances of the dimensions L2, L4 to L6, and is a positive or negative value.

Moreover, as described above, there is play between the control circuit substrate 40 and the substrate support member 50 in the first positioning portion 91, and there is play between the substrate support member 50 and the second case 70 in the third positioning portion 93, and there is play between the first case 60 and the second case 70 in the fourth positioning portion 94. The sum of the play between the control circuit substrate 40 and the substrate support member 50 in the first positioning portion 91, the play between the substrate support member 50 and the second case 70 in the third positioning portion 93, and the play between the first case 60 and the second case 70 in the fourth positioning portion 94 is represented by D. The sum D of the play is a positive or negative value.

The positional tolerance between the signal connector 80 and the opening 61a of the opening portion 61 is the sum of the value C represented by the above-described formula (5) and the above-described sum of the plays, and is expressed by the following formula (6).

$$(Positional\ tolerance)=C+D \quad (6)$$

As described above, since the position of the intermediate member 100 in plan view is determined in accordance with the signal connector 80, the positional tolerance between the outer peripheral portion 110a of the insertion portion 110 of the intermediate member 100 and the opening 61a of the opening portion 61 is substantially equal to the above-described positional tolerance between the connector 80 and the opening 61a of the opening portion 61. Therefore, it is preferable that the size of the opening 61a of the opening portion 61 be larger than the size of the outer peripheral portion 110a of the insertion portion 110 by at least the above-described positional tolerance. As illustrated in FIGS. 3 and 5, in the power conversion apparatus 1 according to the present embodiment, there provided a gap 131 that absorbs the above-described positional tolerance between the opening 61a of the opening portion 51 and the outer peripheral portion 110a of the insertion portion 110.

Moreover, it is preferable that the inner diameter of the lower hole 122 of the fixing portion 120 be larger than the outer diameter of the case-side boss 62 by at least the above-described positional tolerance. Similarly, it is preferable that the inner diameter of the upper hole 121 of the fixing portion 120 be larger than the diameter of the bolt 123 by at least the above-described positional tolerance. In this manner, in the power conversion apparatus 1 according to the present embodiment, there is provided a gap 132 that absorbs the above-described positional tolerance between the inner peripheral surface of the lower hole 122 of the fixing portion 120 and the outer peripheral surface of the case-side boss 62, and there provided a gap 133 that absorbs the above-described positional tolerance between the inner peripheral surface of the upper hole 121 of the fixing portion 120 and the bolt 123.

The above-described power conversion apparatus achieves the following operational effects.

(1) The apparatus includes: the signal connector 80 that transmits a signal to the control circuit 41; the control circuit substrate 40 connected to the signal connector 80; the first case 60 forming an housing space for the control circuit substrate 40 and forming the opening portion 61; and the intermediate member 100 interposed between the signal connector 80 and the first case 60, in which the intermediate member 100 includes the opening 103 through which the signal connector 80 passes, the first seal surface 112 with the signal connector 80, and the fixing portion 120 to be fixed onto the first case 60, and the fixing portion 120 is formed so as to absorb a positional tolerance between the signal connector 80 and the opening 61a of the opening portion 61 of the first case 60. This makes it possible to enhance the connection workability between the external connection member 89 and the signal connector 80 while maintaining the sealability inside the housing constituted with the first case 60 and the second case 70.

(2) The intermediate member 100 is configured to be displaceable with respect to a plane parallel to an opening surface of the opening portion 61. This allows the intermediate member 100 to absorb the positional tolerance between the signal connector 30 and the opening 61a of the opening portion 61. This makes it unnecessary to demand more precision for dimensional tolerance of each of the portions related to the positional tolerance between the signal connector 80 and the opening 61a of the opening portion 51, leading to suppression of the manufacturing cost of the power conversion apparatus 1.

The signal connector 80, which is smaller than the first case 60 is arranged in an accommodation space of the first case 60 together with the control circuit substrate 40, and a gap formed between the opening portion 61 of the first cage 60 and the signal connector 80 arranged in the opening portion 61. Therefore, it is preferable that the intermediate member 100 includes the insertion portion 110 to be inserted into the opening portion 61 of the first case 60. Accordingly, in the present embodiment, the intermediate member 100 further includes the insertion portion 110 to be inserted into the opening portion 61, the opening 103 is formed in the insertion portion 110, and the insertion portion 110 is formed so as to provide, within the opening portion 61, the gap 131 between the insertion portion 110 and the opening portion 61, the gap 131 being provided to absorb the positional tolerance between the opening portion 61 and the signal connector 80. With this configuration, the intermediate member 100 moves parallel to the opening plane 61b in accordance with the signal connector 80 in the process of insertion of the connector main body 81 into the opening 103, determining the position in plan view. This configuration facilitates the work of attaching the intermediate member 100, making it possible to suppress the assembly cost of the power conversion apparatus 1.

(4) The apparatus includes the seal member 82 that abuts the first seal surface 112, in which, when projection is performed from a direction perpendicular to the opening surface of the opening portion 61, the insertion portion 110 is formed such that a projection portion of the insertion portion 110 is smaller than a protection portion of the opening portion 61 by the gap 131, and the seal member 82 is formed such that a projection portion of the seal member 82 is smaller than the projection portion of the insertion portion 110. With this configuration, possible to seal the gap between the first seal surface 112 and the outer periphery of the connector main body 81 even in a case where there is a positional tolerance between the opening 61a of the opening portion 61 and the signal connector 80, making it possible to ensure airtightness of the power conversion apparatus 1 and enhance the durability and reliability of the power conversion apparatus 1.

(5) The apparatus includes the pressing force buffering material 52 provided between the control circuit substrate 40 and the substrate support member 50, in which the signal connector includes the connector-side substrate contact portion 84 coming in contact with the control circuit substrate 40 and configured to receive the pressing force generated by the connection with the external connection member 89, and the pressing force buffering material 52 receives a pressing force from the connector-side substrate contact portion 84. With this configuration the pressurizing force acting on the signal connector 80 when the external connection member 89 is attached is transmitted to the substrate support member 50 via the control circuit substrate 40 and the pressing force buffering material 52. Moreover, the pressurizing force received by the signal connector 80 from the intermediate member 100 when the intermediate member 100 is attached is also transmitted to the substrate support member 50 via the control circuit substrate 40 and the pressing force buffering material 52. This configuration makes it possible to prevent damage to the connection portion due to solder or the like between the signal pin 83 and the control circuit substrate 40 attributed to the pressurizing force acting on the signal connector 80.

(6) In the opening 103, the tapered portion 111 is formed at the tip end on the side closer to the first case 60. This configuration allows the intermediate member 100 to be guided by the outer periphery of the connector main body 81 of the signal connector 80 and the tapered portion 111 of the intermediate member 100, making it possible to facilitate the attachment work of the intermediate member 100, leading to suppression of the assembly cost of the power conversion apparatus 1.

Modification (1) While the above, description is an exemplary case of the electric power conversion apparatus mounted on electric vehicles such as an electric automobile, a hybrid automobile, the electric power conversion apparatus according to the present invention is not limited to the on-vehicle equipment, and can also be applied to a power conversion apparatus used in an ordinary industrial power supply system. Moreover, the present invention is not limited to the power conversion apparatus and can also be applied to other electric circuit apparatuses such as an engine control apparatus of a vehicle.

(2) While the above description is an exemplary case where the signal connector 80 is a connector that transmits a signal or the like of the target torque value, the connector may transmit, for example, a driving current for driving the power transformer in a driver circuit.

(3) While the above description is an exemplary case where the first case 60 has a lidded and bottomless box-like shape, the first case 60 may be a lid-like member covering the upper surface of the second case 70. That is, instead of the above-described first case 60, a member having a shorter height of the peripheral wall portion of the first case 60, or a member without the peripheral wall portion of the first case 60 may be attached to the second case 70 as a case member to constitute the housing together with the second case 70. While the above description is an exemplary case where the second case 70 has a lidded and bottomless box-like shape, the second case 70 may be a member covering the bottom surface of the first case 60. That instead of the above-described second case 70, member having a shorter height of the peripheral wall portion of the second case 70, or a member without the peripheral wall portion of the second case 70 may be attached to the first case 60 as a case member to constitute the housing together with the first case 60.

(4) Each of the embodiments and modifications described above may be combined with each other.

The present invention not limited to the above-described embodiments, and other forms conceivable within the technical scope of the present invention are also included in the scope of the present invention as long as the features of the present invention can be maintained. Furthermore, a combination of the above-described embodiment(s) and a plurality of modifications may be adopted.

REFERENCE SIGNS LIST 1 power conversion apparatus
40 control circuit substrate.
41 control circuit
50 substrate support member.
60 first case
61 opening portion
61a opening
70 second case
80 signal connector
52 pressing force buffering material
84 connector-side substrate contact portion
100 intermediate member
103 opening
110 insertion portion
111 tapered portion
112 first seal surface
120 fixing portion
131 gap

The invention claimed is:

1. An electric circuit apparatus comprising:
a connector that transmits one of a driving current and a signal to an electric circuit unit;
a substrate connected to the connector;
a first case member forming an housing space for the substrate and forming an opening portion; and
an intermediate member interposed between the connector and the first case member, the intermediate member including an insertion portion to be inserted into the opening portion, wherein
the intermediate member includes a connector-side opening portion through which the connector passes, a seal surface with the connector, and a fixing portion to be fixed on the first case member, and
a gap that absorbs a positional tolerance between an opening of the opening portion and an outer peripheral portion of the insertion portion.

2. The electric circuit apparatus according to claim 1, wherein the intermediate member is configured to be displaceable with respect to a plane parallel to an opening surface of the opening portion.

3. The electric circuit apparatus according to claim 1, comprising
   a second case member that directly or indirectly fixes the substrate.

4. The electric circuit apparatus according to claim 3, comprising
   a substrate support member that indirectly fixes the substrate to the second case member.

5. The electric circuit apparatus according to claim 1, wherein
   the connector-side opening portion is formed in the insertion portion, and
   the insertion portion is formed so as to provide, within the opening portion, a gap between the insertion portion and the opening portion, the gap being provided to absorb the positional tolerance between the opening portion and the connector.

6. The electric circuit apparatus according to claim 5, further comprising
   a seal member that abuts the seal surface, wherein, when projection is performed from a direction perpendicular to an opening surface of the opening portion,
   the insertion portion is formed such that a projection portion of the insertion portion is smaller than a projection portion of the opening portion by the gap, and
   the seal member is formed such that a projection portion of the seal member is smaller than the projection portion of the insertion portion.

7. The electric circuit apparatus according to claim 4, comprising a pressing force buffering material provided between the substrate and the substrate support member,
   wherein the connector includes a substrate contact portion coming in contact with the substrate and configured to receive a pressing force generated by the connection with an external connector, and
   the pressing force buffering material receives a pressing force from the substrate contact portion.

8. The electric circuit apparatus according to claim 1, wherein the connector-side opening portion has a taper formed at a tip end closer to the first case member.

* * * * *